US009606565B2

(12) United States Patent
Augesky et al.

(10) Patent No.: US 9,606,565 B2
(45) Date of Patent: Mar. 28, 2017

(54) POWER SUPPLY WITH A SWITCH CONVERTER

(71) Applicant: Siemens Aktiengesellschaft, Munich (DE)

(72) Inventors: Christian Augesky, Vienna (AT); Daniel Portisch, Mistelbach (AT)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 14/949,245

(22) Filed: Nov. 23, 2015

(65) Prior Publication Data

US 2016/0154418 A1 Jun. 2, 2016

(30) Foreign Application Priority Data

Nov. 28, 2014 (DE) .................... 20 2014 009 500 U

(51) Int. Cl.
*H02M 3/156* (2006.01)
*G05F 3/26* (2006.01)
*H02M 1/00* (2006.01)
*G01R 31/40* (2014.01)
*G01R 19/00* (2006.01)

(52) U.S. Cl.
CPC .............. *G05F 3/26* (2013.01); *H02M 3/156* (2013.01); *G01R 19/0092* (2013.01); *G01R 31/40* (2013.01); *H02M 2001/0009* (2013.01)

(58) Field of Classification Search
CPC ......... H02M 2001/0009; H02M 3/156; H02M 3/158; G05F 1/575
See application file for complete search history.

(56) References Cited

U.S. PATENT DOCUMENTS

| 5,917,312 | A | 6/1999 | Brkovic | |
|---|---|---|---|---|
| 6,424,129 | B1 | 7/2002 | Lethellier | |
| 6,969,979 | B2 * | 11/2005 | Kohout .................. | H02M 3/158 323/282 |
| 7,642,762 | B2 * | 1/2010 | Xie ........................ | H02M 3/156 315/224 |
| 7,795,846 | B2 * | 9/2010 | Martin ................... | H02M 3/156 323/222 |
| 7,994,766 | B2 * | 8/2011 | De Lima Filho ..... | H02M 3/158 323/277 |
| 9,088,208 | B2 * | 7/2015 | Isham ................. | G01R 19/0092 |
| 2011/0156687 | A1 | 6/2011 | Gardner et al. | |

(Continued)

*Primary Examiner* — Gary L Laxton
(74) *Attorney, Agent, or Firm* — Cozen O'Connor

(57) ABSTRACT

A power supply has a switch converter, a circuit breaker, a storage inductor and a peak current controller, wherein a first shunt resistor is arranged in a positive cable, a first operational amplifier is connected the first shunt resistor to detect a voltage drop across the first shunt resistor, an auxiliary measuring signal at the output of the first operational amplifier is reflected via a current mirror to ground, a second operational amplifier is connected to the second shunt resistor for impedance amplification such that a DC measuring signal is present at the output of the second operational amplifier, an RC element having a resistor and capacitor is connected to an inductor, the RC element being configured such that an AC measuring signal at the output of the RC element reproduces a current through the storage inductor, and where the AC measuring signal is added to the DC measuring signal.

14 Claims, 3 Drawing Sheets

(56) References Cited

U.S. PATENT DOCUMENTS

2012/0187931 A1* 7/2012 Maruki ................ H02M 3/156
  323/282
2013/0154595 A1 6/2013 Drinovsky

* cited by examiner

POWER SUPPLY WITH A SWITCH CONVERTER

BACKGROUND OF THE INVENTION

1. Field of the Invention

The invention relates to a power supply with a switch converter which can be connected to an input-side voltage via a positive cable and to a ground potential via a negative cable and comprises a circuit breaker, a storage inductor and a peak current controller.

2. Description of the Related Art

Power supplies with switch converters serve to convert a supply voltage into a desired output voltage. Here, a rectified intermediate circuit voltage is generally converted into a constant output DC voltage.

A common control variant comprises a peak current controller, to which the current is supplied by a storage inductor as an input variable. As soon as the detected inductance current conforms to a predetermined peak value, the circuit breaker is switched off. Here, the circuit breaker is controlled via a pulse width modulation circuit that interacts with the peak current controller.

Known solutions for detecting the current through the storage inductor utilize a shunt resistor arranged in the negative cable. The voltage drop across this shunt resistor serves as a measured variable for the current to be detected, where the resulting measuring signal with respect to the ground potential is present.

SUMMARY OF THE INVENTION

It is an object of the invention to provide a power supply which detects current in a positive cable flowing through a storage inductor.

This and other objects and advantages are achieved in accordance with the invention by providing a power supply in which a first shunt resistor is arranged in the positive cable, and a first operational amplifier is connected to the first shunt resistor to detect a voltage drop across the first shunt resistor, where an auxiliary measuring signal at the output of the first operational amplifier is reflected via a current mirror across a second shunt resistor onto a ground potential, where a second operational amplifier is connected to the second shunt resistor for impedance amplification so that a DC measuring signal is present at the output of the second operational amplifier, where an RC element is further connected to the storage inductor, the resistor and capacitor of which are configured such that an AC measuring signal at the output of the RC element reproduces a current through the storage inductor, and where the AC measuring signal is added to the DC measuring signal.

The discretely configured circuit easily detects current flowing through the storage inductor in the positive cable, where the resulting measuring signal is related to the ground potential. Simple components are used here, which ensure a reliable function of the circuit functions reliably. The interaction of the two operational amplifiers with the current mirror generates a DC measuring signal, which specifies the averaged current through the storage inductor. In other words, this is the DC component (DC portion) of the detected current.

Switching the circuit breaker produces an AC component (AC portion) which overlays this DC component. This AC component is detected via the RC element, in order to generate a corresponding AC measuring signal for the peak current controller.

By adding the AC measuring signal to the DC measuring signal, a resulting measuring signal is produced, which reproduces with sufficient accuracy both the present DC component and also the present AC component of the current flowing through the storage inductor.

Here, the dimensioning of the resistor and the capacitor of the RC element defines a time constant that is adjusted to the time constant of the power elements. The latter time constant is defined by the interaction of the storage inductor with a DC resistor present in the electric circuit.

Moreover, the dimensioning of the resistor and the capacitor of the RC element is matched to the amplification of the DC measuring signal. As a result, the AC measuring signal is also present with a corresponding amplification.

The inventive detection of the current flowing through the storage inductor in the positive cable is sufficiently accurate to operate the peak current controller, on the one hand, and on the other hand to regulate the output current of the power supply to a desired value.

In a simple embodiment, an input-side connection of the storage inductor is connected to a first connection of the resistor of the RC element, an output-side connection of the storage inductor is connected to a first connection of the capacitor of the RC element and a second connection of this resistor and a second connection of this capacitor is connected at the output of the RC element.

The output of the RC element is expediently connected to the output of the second operational amplifier via a high-pass filter. This thus ensures that even under unfavorable conditions, only the AC component of the AC measuring signal is added to the DC measuring signal.

Here, it is favorable if the output of the RC element is connected to a measurement output via a filter capacitor and if the output of the second operational amplifier is connected to the measurement output via a filter resistor. The high-pass filter is thus configured as a further RC element. The resulting measuring signal is present at the measurement output, where the measuring signal is supplied to the peak current controller.

It is expedient for the amplifier circuit for detecting the DC component if a snubber resistor is arranged between the positive cable and the negative input of the first operational amplifier. This snubber resistor is used to adjust the input resistance of the first operational amplifier.

To ensure the stability of the amplifier circuit, it is advantageous if a smoothing capacitor is arranged between the output of the first operational amplifier and the negative input of the first operational amplifier. An unwanted oscillation of the amplifier circuit is thus prevented.

In an advantageous embodiment, the current mirror comprises a first and a second PNP transistor, where the first PNP transistor is coupled as a diode, the emitter electrode of the first PNP transistor and the emitter electrode of the second PNP transistor are connected to the output of the first operational amplifier via a first series resistor and a second series resistor in each case, the collector electrode of the first PNP transistor is connected to the negative input of the first operational amplifier, and where the collector electrode of the second PNP transistor is connected to the ground potential by way of the second shunt resistor. Suitable dimensioning of the series resistors enables the mirror circuit to be adjusted to the given requirements, with reduced effects on component tolerances and temperature drift.

The second operational amplifier is advantageously formed as an inverting amplifier via two snubbing resistors. As a result, the DC measuring signal present at the output can be easily added to the AC measuring signal.

The inventive current determination is advantageous particularly in the case of a current control, if namely the DC measuring signal or the DC measuring signal with the added AC measuring signal is supplied to a current control circuit, which regulates an output current of the switch converter to a desired value.

In an advantageous further embodiment, at least one further switch converter is arranged in the power supply and all switch converters have a shared negative cable. The power supply then comprises at least two switch converters for scaling the transmittable power or for supplying a number of consumers.

Here, it is favorable if the outputs of two switch converters are connected in parallel. In this case, the switch converters have positive output terminals that are connected to one another to increase the output power.

For an advantageous manufacture and operation of the power supply with a number of switch converters, it is favorable if all switch converters have the same construction.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The invention is explained by way of example below with reference to the appended figures, in which.

DETAILED DESCRIPTION OF THE EXEMPLARY EMBODIMENTS

Figure 1:
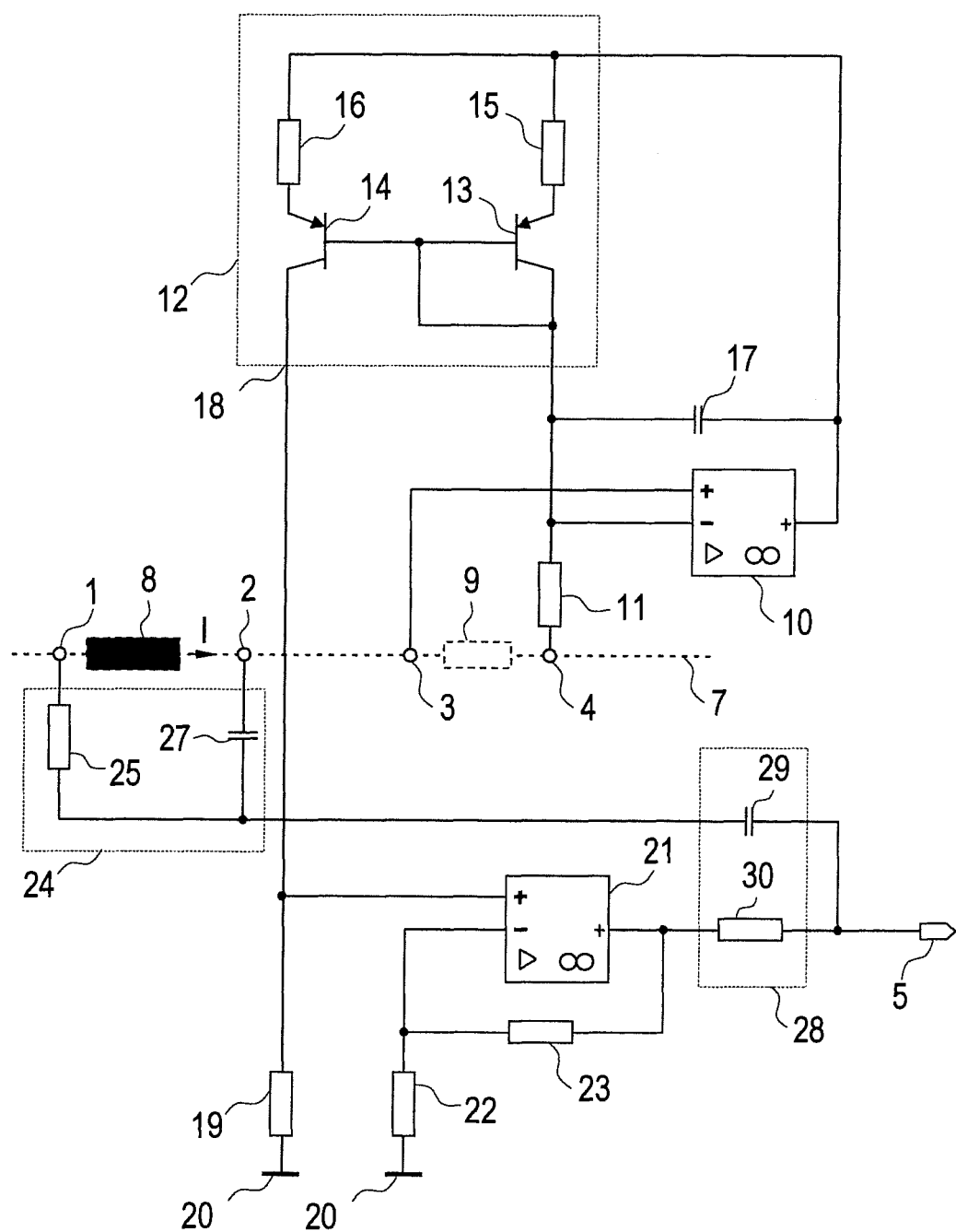
FIG. 1 schematically shows a circuit arrangement for detecting the current flowing through the storage inductor in accordance with the invention.

The circuit arrangement shown in FIG. 1 comprises five contact points 1, 2, 3, 4, 5 for connecting to a common base of a switch converter 6. The elements of the common base required for the explanation, i.e., the positive cable 7, the storage inductor 8 and a first shunt resistor 9, are indicated with dashed lines. A switching throttle serves in the present example as a storage inductor 8.

In the current flow direction of the current I to be detected, the first contact point 1 is arranged immediately upstream of the storage inductor 8, the second contact point 2 is arranged immediately downstream of the storage inductor 8, the third contact point 3 is arranged immediately upstream of the first shunt resistor 9 and the fourth contact point 4 is arranged immediately downstream of the first shunt resistor 9. The measurement output 5 of the circuit at which the resulting measuring signal is present forms the fifth contact point.

The third contact point 3 is connected to the positive input of a first operational amplifier 10. The negative input of the first operational amplifier 10 is connected to the fourth contact point 4 via a snubber resistor 11. The voltage drop across the first shunt resistor 9 is thus present at the input of the first operational amplifier 10, where an input resistance of the negative input of the first operational amplifier 10 can be defined via the snubber resistor 11. This measuring arrangement for detecting the current I flowing through the positive cable 7 generates an auxiliary measuring signal at the output of the first operational amplifier 10, where the auxiliary measuring signal is reflected via a current mirror 12.

The current mirror 12 comprises two PNP transistors 13, 14, the emitter electrodes of which are each connected via a series resistor 15, 16 to the output of the first operational amplifier 10. In this way, the input-side PNP transistor 13 is coupled as a diode, by the collector electrode being connected to the base electrode. The collector electrode of this PNP transistor 13 is also connected to the negative input of the first operational amplifier 10. A 1:1 current mirror is provided where the PNP transistors 13, 14 and the series resistors 15, 16 are the same.

The series resistors 15 and 16 reduce the effects of component tolerances and temperature drift. Moreover, a smoothing capacitor 17 is arranged between the negative input of the first operational amplifier 10 and its output, in order to avoid an unwanted oscillation of the amplifier circuit.

At the output 18 of the current mirror 12 flows a current, which in the case of a 1:1 current mirror corresponds to the auxiliary measuring signal. This current flows via a second shunt resistor 19 to the ground potential 20 of the circuit. The voltage drop in the process is present at the positive input of a second operational amplifier 21. The negative input thereof is present at the ground potential 20 via a first snubber resistor 22. A second snubber resistor 23 is arranged between the negative input and the output of the second operational amplifier 21. A positive DC measuring signal is present at the output of this inverting amplifier, where the DC measuring signal is proportional to the current I flowing through the positive cable 7.

Accuracy is the main focus of the two operational amplifiers 10, 21, in order to ensure an optimal control signal for a current control. This requirement is usually at the expense of speed, which is why an AC component is only inadequately detected. The triangular current curves, which result from the switching cycles of the switch converter 6 and are essential to the peak current controller, are characteristic of the AC component.

An additional circuit is thus provided to detect the AC component. This comprises an RC element 24 that reproduces the rapid current changes in the storage inductor 8. For this purpose, the time constant of the RC element 24 is adjusted to that time constant, which is determined by the interaction of the storage inductor 8 with a DC resistor present in the current circuit. Amplification by the aforedescribed amplifier circuit is also taken into account when dimensioning the resistor 25 and the capacitor 27 of the RC element 24, so that the AC measuring signal and the DC measuring signal are matched to one another.

The AC measuring signal detected in this way is added to the DC measuring signal via a high-pass filter 28. Here, a filter capacitor 29 is arranged between the RC element 24 and the measurement output 5, and a filter resistor 30 is arranged between the output of the second operational amplifier 21 and the measurement output 5. The effect of the high-pass filter 28 ensures that only the AC component of the AC measuring signal is added to the DC measuring signal.

The measuring signal present at the measurement output 5 combines the advantages of the two circuit parts, i.e., the accuracy of the amplifier circuit and the speed of the RC element 24.

Figure 2:
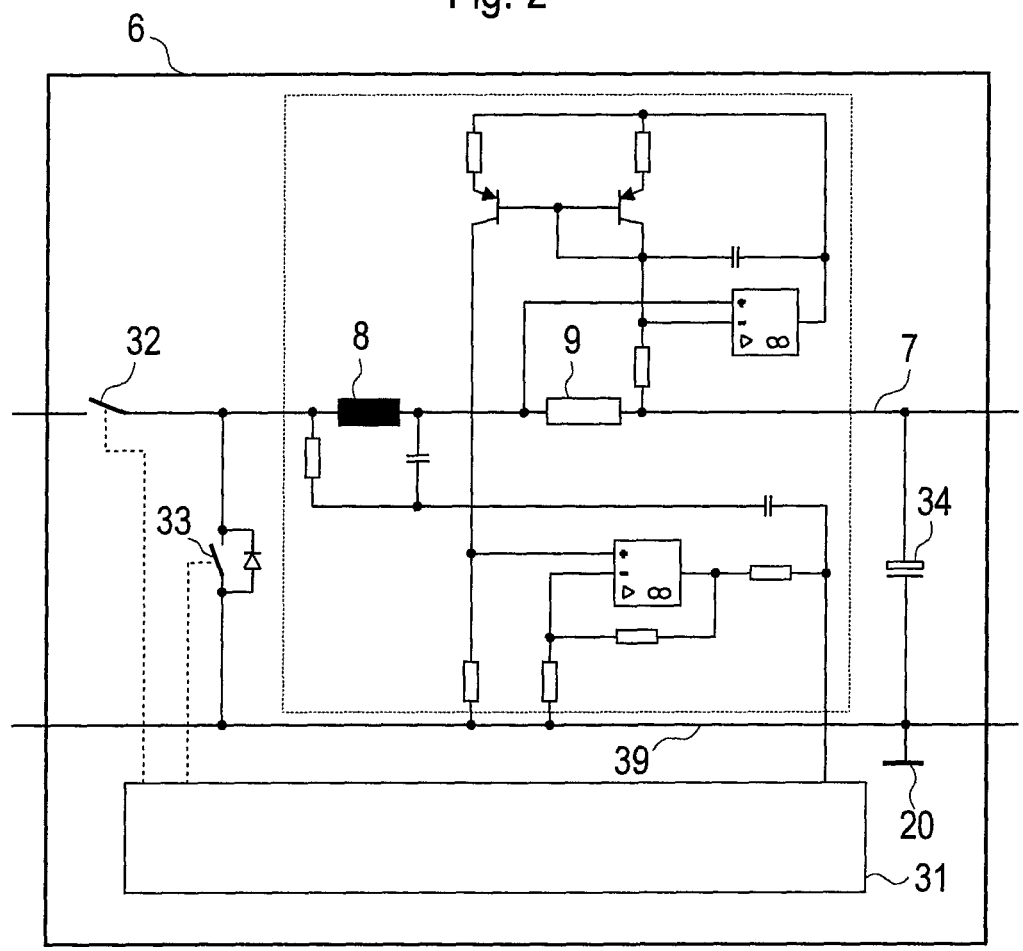
FIG. 2 schematically shows the use of the circuit arrangement according to FIG. 1 in a step-down converter in accordance with the invention.

By way of example, FIG. 2 shows a step-down converter as a switch converter 6, where the step-down converter utilizes the afore-described current detection circuit to detect the current I in the positive cable 7. The step-down converter 6 comprises a control unit 31, to which the resulting measuring signal is supplied. A circuit breaker 31 is connected via a pulse width modulation circuit implemented in the control unit 31 in conjunction with a peak current controller. The triangular AC component of the measuring signal is essential, here.

The AC component of the measuring signal serves as an input signal of a current control, if the step-down converter is operated in current control mode.

An auxiliary switch 33 is arranged in the step-down converter shown instead of a simple diode for the periodic demagnetization of the storage inductor 8. The embodiment as a switch results in lower losses during a demagnetization phase. An output capacitor 34 is disposed at the output of the step-down converter as a smoothing element.

Figure 3:
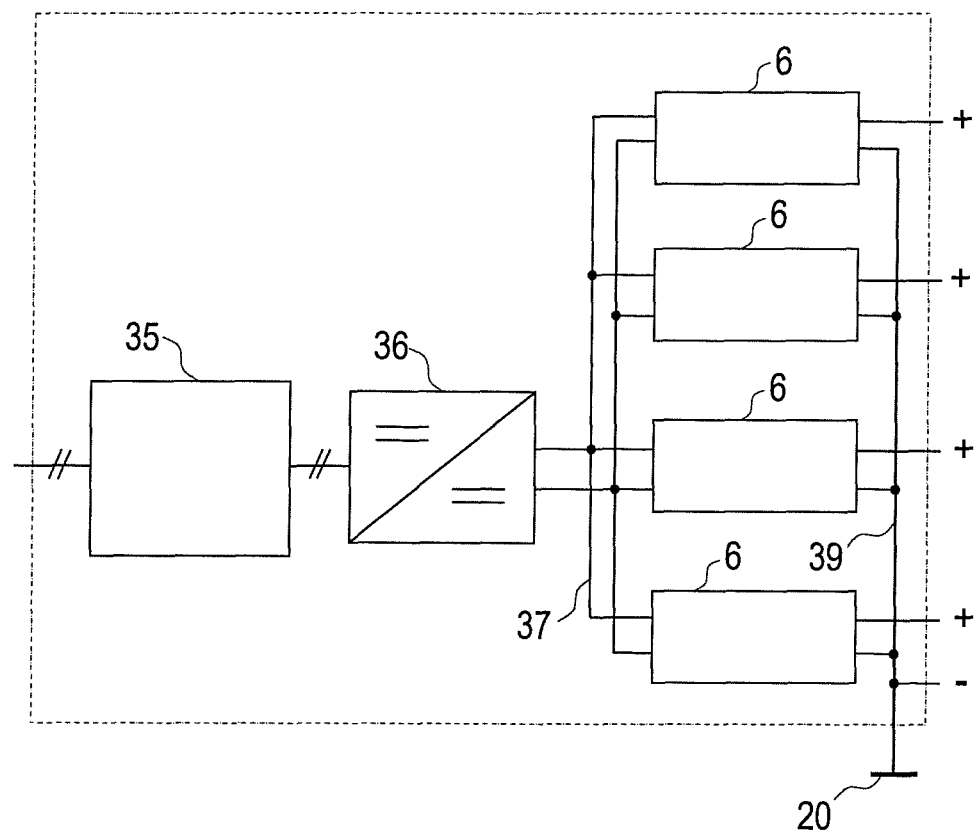
FIG. 3 schematically shows the power supply with a number of switch converters in accordance with the invention.

A power supply with four switch converters 6 is shown in FIG. 3. A rectifier 35 is arranged on the input side, where the rectifier converts a mains voltage into a DC voltage. A DC-DC converter 36, which supplies an intermediate circuit 37, is connected to the rectifier 35. The intermediate circuit 37 is advantageously configured as a low-voltage intermediate circuit with a voltage level of up to, e.g., 45V. The output DC voltages at the outputs of the individual switch converters 6 are below this voltage level (e.g., 25V).

A power supply of this type is particularly suited to supplying a number of consumers or to scaling the transmittable power, by a number of outputs being connected in parallel.

The advantage of the inventive current detection is particularly relevant with this power supply because all switch converters 6 use a shared negative cable 39, through which all the current of all switch converters 6 flows. The current of the corresponding switch converter 6 to be detected only flows in the respective positive cable.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A power supply including a switch converter, and which is connectable to an input-side voltage by a positive cable and to a ground potential by a negative cable, the power supply comprising:
    a circuit breaker;
    a storage inductor;
    a peak current controller;
    a first operational amplifier;
    a first shunt resistor arranged in the positive cable and connected to the first operational amplifier to detect a voltage drop across the first shunt resistor;
    a second shut resistor;
    a current mirror which reflects an auxiliary measuring signal at the output of the first operational amplifier via the second shunt resistor onto the ground potential;
    a second operational amplifier connected to the second shunt resistor to provide impedance amplification such that a DC measuring signal is present at an output of the second operational amplifier; and
    an RC element comprising a resistor and capacitor, the RC element being connected to the storage inductor and configured such that an AC measuring signal at an output of the RC element reproduces a current through the storage inductor, the AC measuring signal being added to the DC measuring signal.

2. The power supply as claimed in claim 1, wherein an input-side connection of the storage inductor is connected to a first connection of the resistor of the RC element;
    wherein an output-side connection of the storage inductor is connected to a first connection of the capacitor of the RC element; and
    wherein a second connection of the resistor and a second connection of the capacitor are connected at the output of the RC element.

3. The power supply as claimed in claim 1, wherein the output of the RC element is connected to the output of the second operational amplifier via a high-pass filter.

4. The power supply as claimed in claim 2, wherein the output of the RC element is connected to the output of the second operational amplifier via a high-pass filter.

5. The power supply as claimed in claim 3, wherein the output of the RC element is connected to a measurement output via a filter capacitor; and
    wherein the output of the second operational amplifier is connected to the measurement output via a filter resistor.

6. The power supply as claimed in claim 1, further comprising:
    a snubber resistor arranged between the positive cable and a negative input of the first operational amplifier.

7. The power supply as claimed in claim 1, further comprising:
    a smoothing capacitor is arranged between the output of the first operational amplifier and a negative input of the first operational amplifier.

8. The power supply as claimed in claim 1, wherein the current mirror comprises a first PNP transistor and a second PNP transistor;
    wherein the first PNP transistor is coupled as a diode,
    wherein an emitter electrode of the first PNP transistor and an emitter electrode of the second PNP transistor are each connected to the output of the first operational amplifier via a first series resistor and a second series resistor;

wherein a collector electrode of the first PNP transistor is connected to a negative input of the first operational amplifier, and wherein a collector electrode of the second PNP transistor is connected to the ground potential via the second shunt resistor.

9. The power supply as claimed in claim 1, wherein the second operational amplifier is formed as an inverting amplifier via two snubber resistors.

10. The power supply as claimed in claim 1, wherein one of (i) the DC measuring signal or (ii) the DC measuring signal with the added AC measuring signal is supplied to a current control circuit which regulates an output current of the switch converter to a target value.

11. The power supply as claimed in claim 1, wherein at least one further switch converter is arranged in the power supply and that all switch converters have a shared negative cable.

12. The power supply as claimed in claim 11, wherein outputs of two switch converters are connected in parallel.

13. The power supply as claimed in claim 11, wherein all switch converters are of the same construction.

14. The power supply as claimed in claim 12, wherein all switch converters have the same construction.

\* \* \* \* \*